United States Patent [19]

Nakamura

[11] Patent Number: 5,392,243
[45] Date of Patent: Feb. 21, 1995

[54] SEMICONDUCTOR MEMORY CIRCUIT HAVING LOWER VOLTAGE SUPPLY FOR DATA READING LINES

[75] Inventor: Kazuyuki Nakamura, Tokyo, Japan

[73] Assignee: NEC Corporation, Tokyo, Japan

[21] Appl. No.: 1,657

[22] Filed: Jan. 7, 1993

[30] Foreign Application Priority Data

Jan. 16, 1992 [JP] Japan .................. 4-005265

[51] Int. Cl.⁶ ............................................. G11C 7/00
[52] U.S. Cl. .......................... 365/190; 327/51; 327/543
[58] Field of Search .............. 307/530, 264, 296.8; 365/225.6, 189.11, 190

[56] References Cited

U.S. PATENT DOCUMENTS

| | | | |
|---|---|---|---|
| 4,195,356 | 3/1980 | O'Connell et al. | 365/190 |
| 5,199,000 | 3/1993 | Takahashi | 365/225.6 |

OTHER PUBLICATIONS

Takada et al., "A 5ns 1 Mb ECL BiCMOS SRAM", ISSCC Digest of Technical Papers, pp. 138–139, (1990). Feb. 15, 1990.

*Primary Examiner*—William L. Sikes
*Assistant Examiner*—James Dudek
*Attorney, Agent, or Firm*—Foley & Lardner

[57] ABSTRACT

A read circuit is comprised of a circuit for reading out a data signal from one selected among a plurality of arrayed semiconductor memory cells by using a cascode type sense amplifier, in which the drop of the power supply voltage level and the level shift of the bit lines are properly set to allow the cascode type sense amplifier to operate at a low voltage. The bit lines are clamped to a low voltage level obtained by lowering the power supply voltage level and then the voltage level of the bit lines is shifted by one-stage wired-OR logic circuit in order to assure the stable operation of the cascode type sense amplifier.

8 Claims, 2 Drawing Sheets

1

SEMICONDUCTOR MEMORY CIRCUIT HAVING LOWER VOLTAGE SUPPLY FOR DATA READING LINES

FIELD OF THE INVENTION

The present invention relates to circuits for reading out data in high speed from a semiconductor memory, in particular, to a readout circuit which can operate at low voltage.

BACKGROUND OF THE INVENTION

In a recent semiconductor circuit, through refining techniques of a transistor having a MOS (Metal Oxide Semiconductor) structure, it has become possible to integrate more than one million transistors on a single chip. Further, a Bi-CMOS device having bipolar and CMOS (Complementary MOS) elements lying mixed on a single chip has frequently been used to display their features respectively.

In the Bi-CMOS circuit, a high-speed operable ECL (Emitter Coupled Logic) circuit and a CMOS circuit of low power consumption is combined so that a high speed logic circuit of low power consumption can be realized. As an application of such a Bi-CMOS circuit, a high speed SRAM (Static Random Access Memory) of low power consumption has been proposed by Takada et al (see "A 5 ns 1 Mb BiCMOS SRAM" ISSCC DIGEST of TECHNICAL PAPERS, pp 138–139, 1990).

FIG. 1 illustrates a general peripheral and read circuits of the SRAM. The read-out operation from a memory cell MC is made such that the bit lines B and $\bar{B}$ are first clamped to approximately the power voltage level Vcc (common signal level), and then the data signal is read out from the memory cell MC to the bit lines B and $\bar{B}$ as a small voltage difference from the common signal level, the voltage difference being about several tens of millivolts (mV). The signal which is expressed as the small voltage difference is entered to a sense circuit through gates MP3 and MP4. That sense circuit comprises a two-stage wired-OR logic circuit and a cascode sense amplifier. Each wired-OR circuit comprises an emitter follower circuit of the bipolar transistor, providing the voltage shift equal to the base-to-emitter voltage Vf of the transistor when turned ON. The emitter follower circuits are provided in two stages for the purpose of shifting the voltage level of 2 Vf to stably operate the cascode type sense amplifier. The cascode type amplifier is comprised of a differential sense circuit (or a voltage-to-current converting sense circuit), a signal transmission bus line RB, and a current-to-voltage converting sense circuit. A high speed sensing can be achieved by driving the long bus line RB in the current mode.

The signal read out from the memory cell MC is shifted in voltage level by the two-stage wire-OR circuit to be input to each base of the transistors Q5 and Q6 of the differential sense circuit. Therefore, the potential Va of the common emitter terminal VA of the transistors Q5 and Q6 becomes approximately the voltage of (Vcc−3 Vf), where Vcc denotes the power supply voltage and Vf the base-to-emitter voltage of one of the bipolar transistors Q1 through Q6 when turned ON. Since this base-to-emitter voltage Vf is about 0.8 to 0.9 (V), the potential Va of the common emitter terminal VA becomes about the voltage of (Vcc−2.7). Hence, if the source-to-drain voltage of the field effect transistor MN4 working as a constant current source is taken into account, it can be seen that, if the power supply voltage Vcc is set to a low voltage of 3.0 V, the cascode type sense amplifier ends up in an approximately inoperable state.

SUMMARY OF THE INVENTION

An object of the present invention is to provide a signal read circuit which allows a current mode bipolar sense amplifier, in particular, a cascode type sense amplifier to operate at low voltage.

Another object of the present invention is to provide a signal read circuit which may reduce the power consumption of the semiconductor memory.

According to the present invention, by properly setting both the drop of the power supply voltage and the level shift of the bit lines, the current mode bipolar sense amplifier can be made to operate at the low voltage.

The present invention relates to a circuit for reading the data signal from one selected among a plurality of arrayed semiconductor memory cells by using a current mode bipolar sense amplifier. The circuit is comprised of the following element circuits. A power supply having a first predetermined voltage level supplies the power to the circuit. A low voltage generating circuit generates a lower secondary voltage level by dropping the first voltage level. The secondary voltage level can be applied to the data lines such as the bit lines for taking out the data signal from the memory cell. A level shift circuit is provided between the data lines and the sense amplifier to shift the voltage level of the data lines in order to assure a stable operation of the sense amplifier. The amount of the voltage level shift is determined by taking into account the voltage drop by the low voltage generating circuit.

Preferably, the foregoing low voltage generating circuit comprises a MIS transistor functioning as a resistance with its gate and drain short-circuited, and the foregoing level shifting circuit comprises an one-stage wired-OR logic circuit or an emitter follower circuit comprising a bipolar transistor.

DETAILED DESCRIPTION OF THE PRESENT INVENTION

Figure 2:
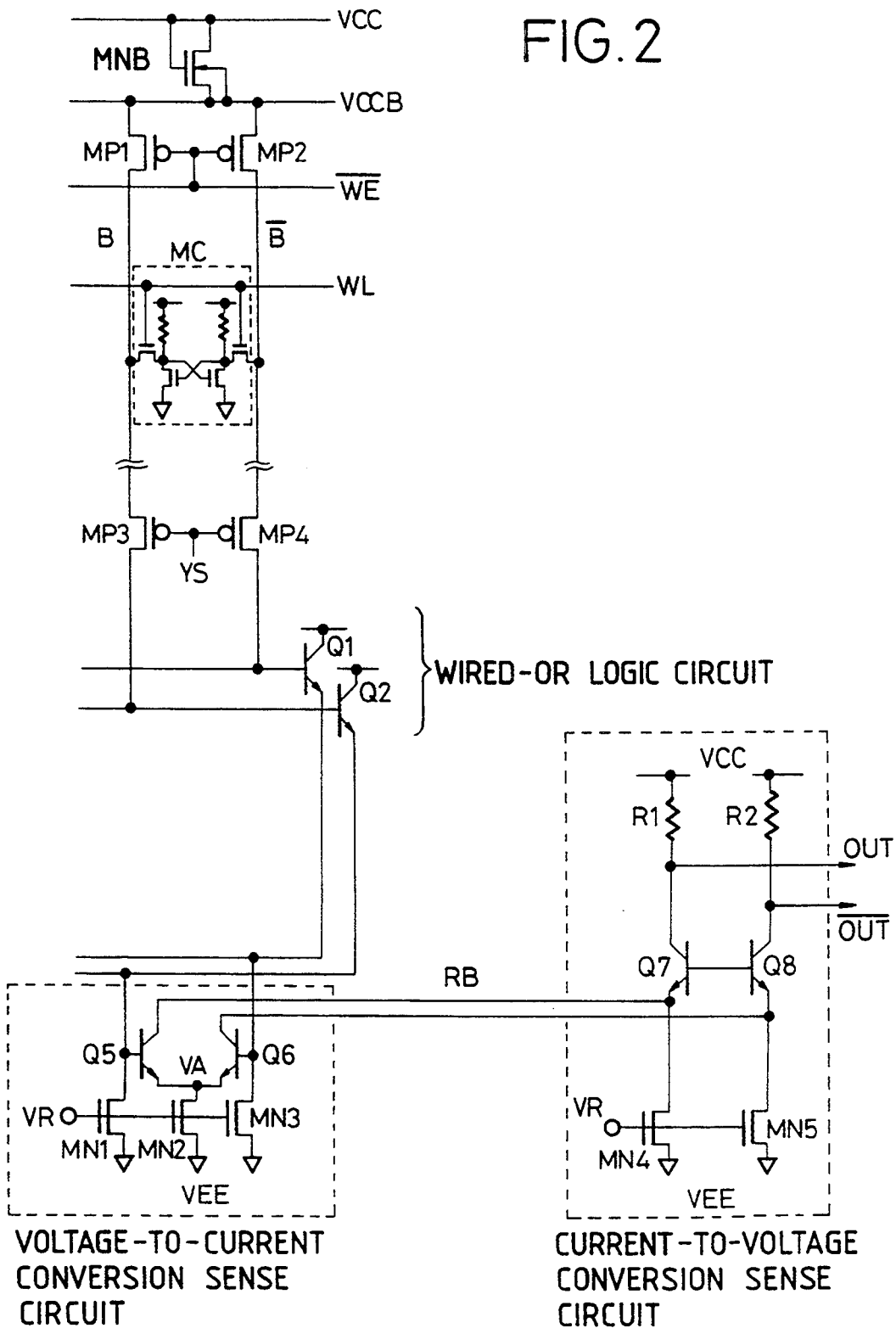
FIG. 2 is a circuit diagram of a specific embodiment of the SRAM read circuit according to the present invention.

Referring to FIG. 2, a flip-flop type memory cell MC comprising MIS (Metal Insulator Semiconductor) transistors is connected to or disconnected from the data reading bit lines B and $\bar{B}$ in accordance with the cell selecting signal on the word line WL. The bit lines B and $\bar{B}$ are each connected to a common level line VCCB through p-channel MIS transistors MP1 and MP2. The gate terminals of those transistors MP1 and MP2 are both connected to a write enable line $\overline{WE}$. Further, the common level line VCCB is connected to a power supply line VCC via an n-channel MIS transistor MNB for clamping. This transistor MNB is used as a resistance short-circuiting the gate and the drain so that the voltage Vccb of the common signal level line VCCB is set lower than the power supply voltage Vcc by Vtn. That is, Vccb=Vcc−Vtn. This potential drop Vtn equals the threshold voltage of the MIS transistor MNB, and herein is about 0.3 V. The n-channel MIS transistor can be readily formed in the integrated circuit, resulting in a stable low voltage level Vccb.

Further, the bit lines B and $\overline{B}$ are connected to the respective base terminals of the bipolar transistors Q2 and Q1 via p-channel MIS transistors MP3 and MP4 for reading data. Each of the transistors Q1 and Q2 comprises an emitter follower circuit. Other bit lines (not shown) are similarly connected to each base of the transistors Q1 and Q2 constituting a wired-OR logic circuit. As described above, the signal read out from the memory cell MC is shifted in voltage level by the base-to-emitter voltage Vf of the transistors Q1 or Q2 in the emitter follower circuit.

The bit lines B and $\overline{B}$ are connected to the cascode type sense amplifier via the one-stage wired-OR circuit. The respective emitter terminals of the transistors Q1 and Q2 in the wired-OR circuit are connected to the base terminals of the bipolar transistors Q6 and Q5 in the differential sense circuit (or the voltage-to-current conversion sense circuit). The common emitter terminal VA of the transistors Q5 and Q6 is connected to the n-channel MIS transistor MN2 as the constant current source. Further, the respective collector terminals of the transistors Q5 and Q6 are connected to the emitter terminals of the bipolar transistors Q7 and Q8 in the current-to-voltage conversion sense circuit through a signal transmission bus line RB. The emitter terminals of the transistor Q7 and Q8 are each connected to the n-channel MIS transistors MN4 and MN5 for the constant current source. The collector terminals of the transistors Q7 and Q8 are connected to the output terminals OUT and $\overline{\text{OUT}}$, respectively, and a voltage difference between the signals of these output terminals OUT and $\overline{\text{OUT}}$ is output as the read signal from the cell MC. As already stated, since the potential of the bus line RB is fixed and is driven in the current mode, the cascode type sense amplifier can sense the data at a high speed without the sense time being delayed even if the bus line RB is long.

In order to stably operate such a cascode type sense amplifier, it is necessary to meet the following condition: $Vcc - 2Vce - dV > Va$, where Vcc denotes the power supply voltage, Vce the emitter-to-collector voltage of the bipolar transistor, dV the potential difference (about 200 mV) between the output Low-level and the voltage level Vcc on the OUT or $\overline{\text{OUT}}$ terminal, and Va the voltage of the common emitter terminal VA of the bipolar transistors Q5 and Q6.

However, the emitter-to-collector voltage Vce of the bipolar transistor approximately equals the base-to-emitter voltage Vf when the transistor is in ON state. As a consequence, in order to allow for a voltage which allows the cascode type sense amplifier to stably operate, the potential Va as viewed from the side of the bit lines B and $\overline{B}$ is set to $Vccb - 2Vf$, that is, $Vcc - Vtn - 2Vf$. In other words, the power supply voltage Vcc is made to drop to set the common voltage level of the bit lines B and $\overline{B}$ to the voltage Vccb while the emitter follower circuit is reduced from the conventional two stages to one. Thus it becomes possible to stably operate the cascode type sense amplifier under the voltage Vccb which is lower than Vcc by Vtn.

Figure 1:
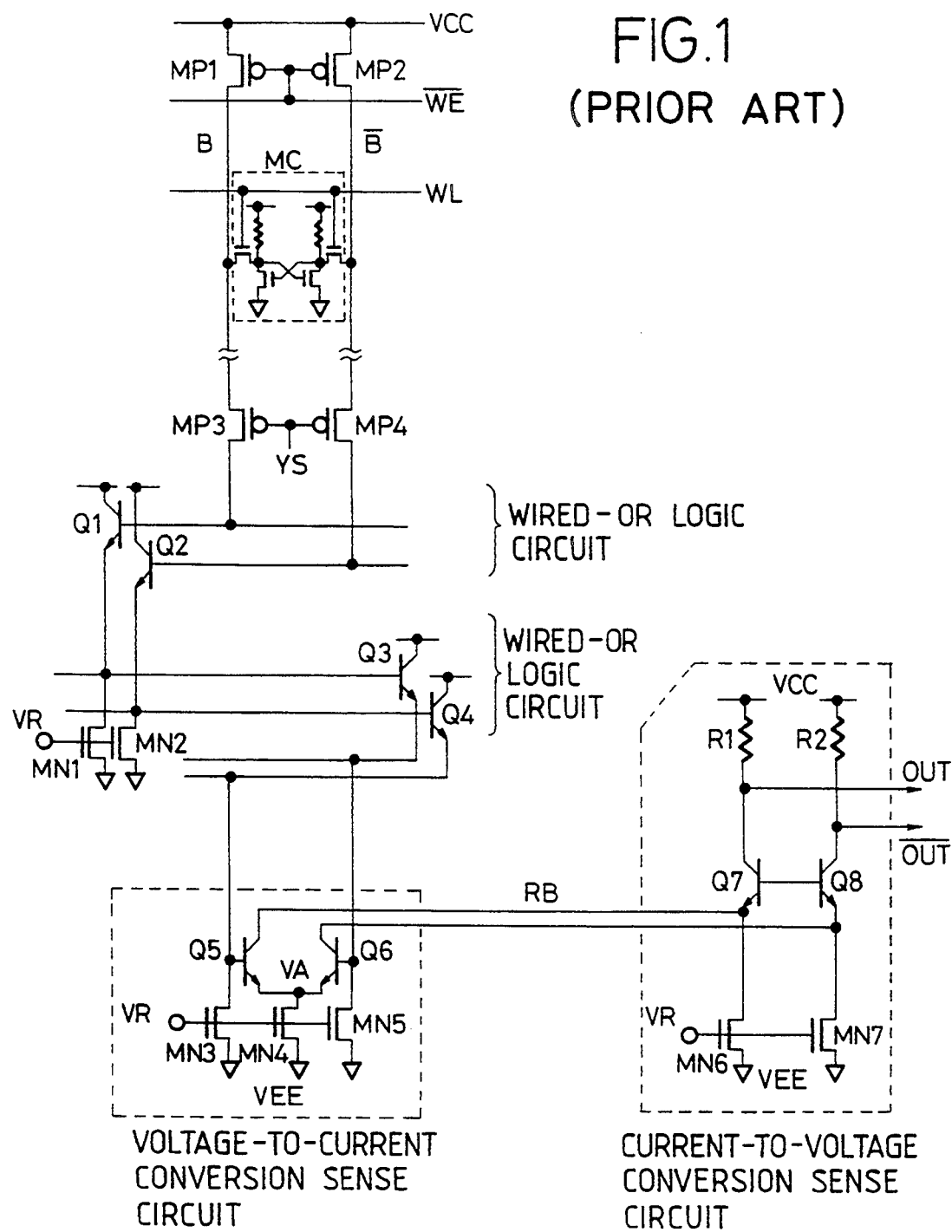
FIG. 1 is a circuit diagram illustrating a conventional example of an SRAM read circuit.

Further, in this embodiment, since the emitter follower circuit which shifts the voltage level is reduced to one stage and the MIS transistor MNB is added to obtain the voltage Vccb, the power consumption can be reduced as compared with the conventional circuit illustrated in FIG. 1 because the base-to-emitter voltage Vf of the bipolar transistor Q3 or Q4 in the emitter follower circuit is about 0.8 V while the voltage drop Vtn of the MIS transistor MNB is about 0.3 V.

How the data is read out according to this embodiment is described. When the write signal of the write enable line $\overline{\text{WE}}$ is turned low, the p-channel clamping MIS transistors MP1 and MP2 are turned OFF, and the bit lines B and $\overline{B}$ are clamped to the common level potential Vccb (lower than Vcc by Vtn). When the memory cell MC is connected to the bit line B and $\overline{B}$ by the selecting signal of the word line WL, the data signal of the memory cell MC emerges at its bit lines B and $\overline{B}$ as a small voltage difference. This data signal expressed as the voltage difference is input to the cascode type sense amplifier through the reading MIS transistors MP3 and MP4 and the wired-OR circuit. In the cascode sense amplifier, the input data signal is converted from the voltage to the current by means of the differential sense circuit, and then is input to the current-to-voltage conversion circuit through the signal transmission bus line RB. And from the output terminals OUT and $\overline{\text{OUT}}$ a signal representing the data stored within the memory cell MC is output as the signal potential difference.

Incidentally, although, in FIGS. 1 and 2, for the sake of simplifying the description, the description was made as to a circuit associated with the one-bit memory cell MC, it is apparent that it only illustrates part of the circuit arrayed with a multiplicity of memory cells.

What is claimed is:

1. A memory circuit comprising:

a pair of data reading lines;

a plurality of semiconductor memory cells each connected to said pair of data reading lines;

a first supply bus connected to a high level supply voltage for supplying power to said memory circuit;

a second supply bus;

a single N-channel MISFET having a gate and a drain connected to said first supply bus and having a source connected to said second supply bus, said N-channel MISFET clamping said second supply bus at a second voltage lower than said high level supply voltage;

a first pair of P-channel MISFETs each having a source connected to said second supply bus and each having a drain connected to a corresponding one of said pair of data reading lines, said first pair of P-channel MISFETs providing said second voltage to said pair of data reading lines according to a write enable signal applied to each gate of said first pair of P-channel MISFETs;

a second pair of P-channel MISFETs each having a source connected to a corresponding one of said pair of data reading lines;

a wired OR circuit comprising a pair of emitter follower bipolar transistors each having a base connected to a corresponding one of said pair of data reading lines through a respective one of said second pair of P-channel MISFETs; and a current mode bipolar sense amplifier connected to each emitter of said pair of emitter follower bipolar transistors.

2. The memory circuit as set forth in claim 1, wherein said N-channel MISFET decreases said high level supply voltage by a threshold voltage of said N-channel MISFET to generate said second voltage.

3. The memory circuit as set forth in claim 1, wherein said current mode bipolar sense amplifier is a cascode type sense amplifier comprising a voltage-to-current converting circuit and a current-to-voltage converting circuit.

4. The memory circuit as set forth in claim 3, wherein said voltage-to-current converting circuit is a differential sense circuit comprising a pair of bipolar transistors, each having a base connected to a corresponding emitter of said bipolar transistors of said wired OR circuit and each having an emitter connected to a low level supply voltage through an N-channel MISFET to create a constant current source.

5. A memory circuit comprising:
a pair of data reading lines;
a plurality of semiconductor memory cells each connected to said pair of data reading lines;
a first supply bus connected to a high level supply voltage for supplying power to said memory circuit;
a second supply bus;
a low voltage generating circuit comprising a single N-channel MISFET having a gate and a drain connected to said first supply bus and having a source connected to said second supply bus, said N-channel MISFET clamping said second supply bus at a second voltage lower than said high level supply voltage;
a load transistor circuit for said pair of data reading lines, said load transistor circuit comprising a first pair of P-channel MISFETs each having a source connected to said second supply bus and each having a drain connected to a corresponding one of said pair of data reading lines, and said first pair of P-channel MISFETs providing said second voltage to said pair of data reading lines according to a write enable signal applied to each gate of said first pair of P-channel MISFETs;
a second pair of P-channel MISFETs each having a source connected to a corresponding one of said pair of data reading lines;
a wired OR circuit comprising a pair of emitter follower bipolar transistors each having a base respectively connected to one of said pair of data reading lines through a corresponding one of said second pair of P-channel MISFETs; and
a current mode bipolar sense amplifier connected to each emitter of said pair of emitter follower bipolar transistors.

6. The memory circuit as set forth in claim 5, wherein said N-channel MISFET decreases said high level supply voltage by a threshold voltage of said N-channel MISFET to generate said second voltage.

7. The memory circuit as set forth in claim 5, wherein said current mode bipolar sense amplifier is a cascode type sense amplifier comprising a voltage-to-current converting circuit and a current-to-voltage converting circuit.

8. The memory circuit as set forth in claim 7, wherein said Voltage-to current converting circuit is a differential sense circuit comprising a pair of bipolar transistors, each having a base connected to a corresponding one of said emitters of said bipolar transistors of said wired OR circuit and each having an emitter connected to a low level supply voltage through an N-channel MISFET to create a constant current source.

* * * * *